United States Patent [19]

Tarng

[11] Patent Number: 4,942,315

[45] Date of Patent: Jul. 17, 1990

[54] BASE POINT FLOATING CUT OFF WAVE FORM DIFFERENTIAL SIGNAL DETECTOR CIRCUIT

[76] Inventor: Lin J. Tarng, 211, Sec. 4, Fu-Hsing Rd., Taichung City, Taiwan, China

[21] Appl. No.: 394,256

[22] Filed: Aug. 14, 1989

Related U.S. Application Data

[63] Continuation of Ser. No. 66,539, Jun. 26, 1987, abandoned.

[51] Int. Cl.$^5$ .................. H03K 5/08; H03K 5/153
[52] U.S. Cl. ............................. 307/358; 307/268; 307/491; 307/494
[58] Field of Search ............. 307/268, 350, 358, 491, 307/494

[56] References Cited

U.S. PATENT DOCUMENTS

4,175,256  11/1979  Dolikian .................. 307/358
4,217,553  8/1980  Winebarger ............. 307/268

FOREIGN PATENT DOCUMENTS

1965100  7/1970  Fed. Rep. of Germany ...... 307/358
0071319  5/1980  Japan ...................... 307/358

*Primary Examiner*—John Zazworsky
*Attorney, Agent, or Firm*—Ladas & Parry

[57] ABSTRACT

A differential signal detector circuit having a differential signal detector for detecting a differential signal to provide a detecting signal and a comparing detector having a timer with a time constant for comparing the detecting signal with a base point signal and providing a differential signal detection signal when the detected differential signal differs sufficiently from a base point signal is improved by providing a floating base point signal. For this, the circuit additionally has a floating base point loop for providing the floating base point signal, a wave form cuttoff loop for cutting off the affect of the floating base point loop, and a voltage balance loop for avoiding directional impedance differences. As a result, the differential signal detector circuit produces the detection signal only when the differential signal exceeds the floating base point signal sufficiently for a sufficient time.

1 Claim, 3 Drawing Sheets

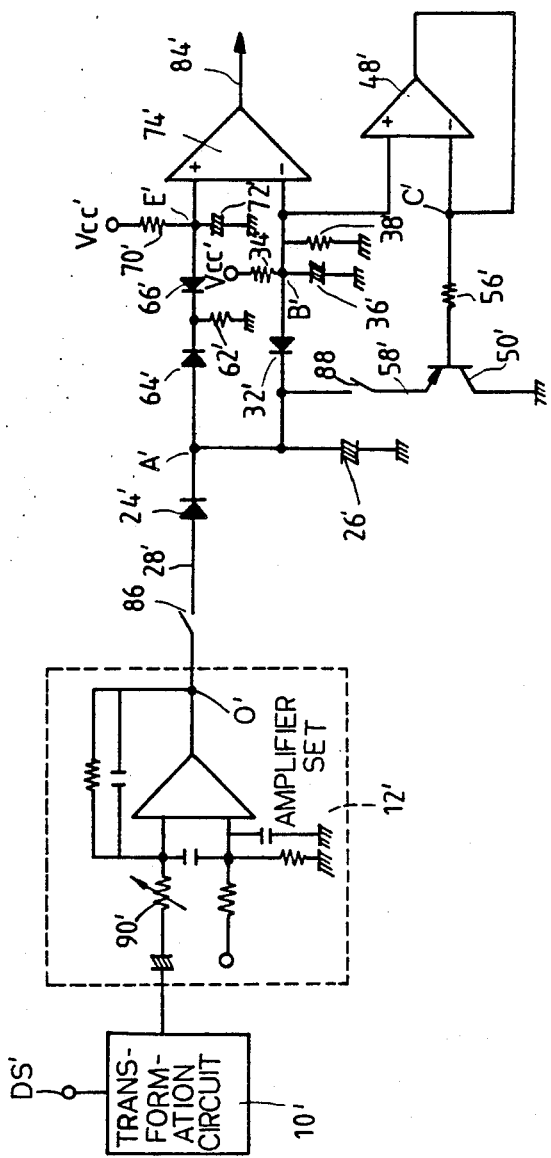
F I G. 3

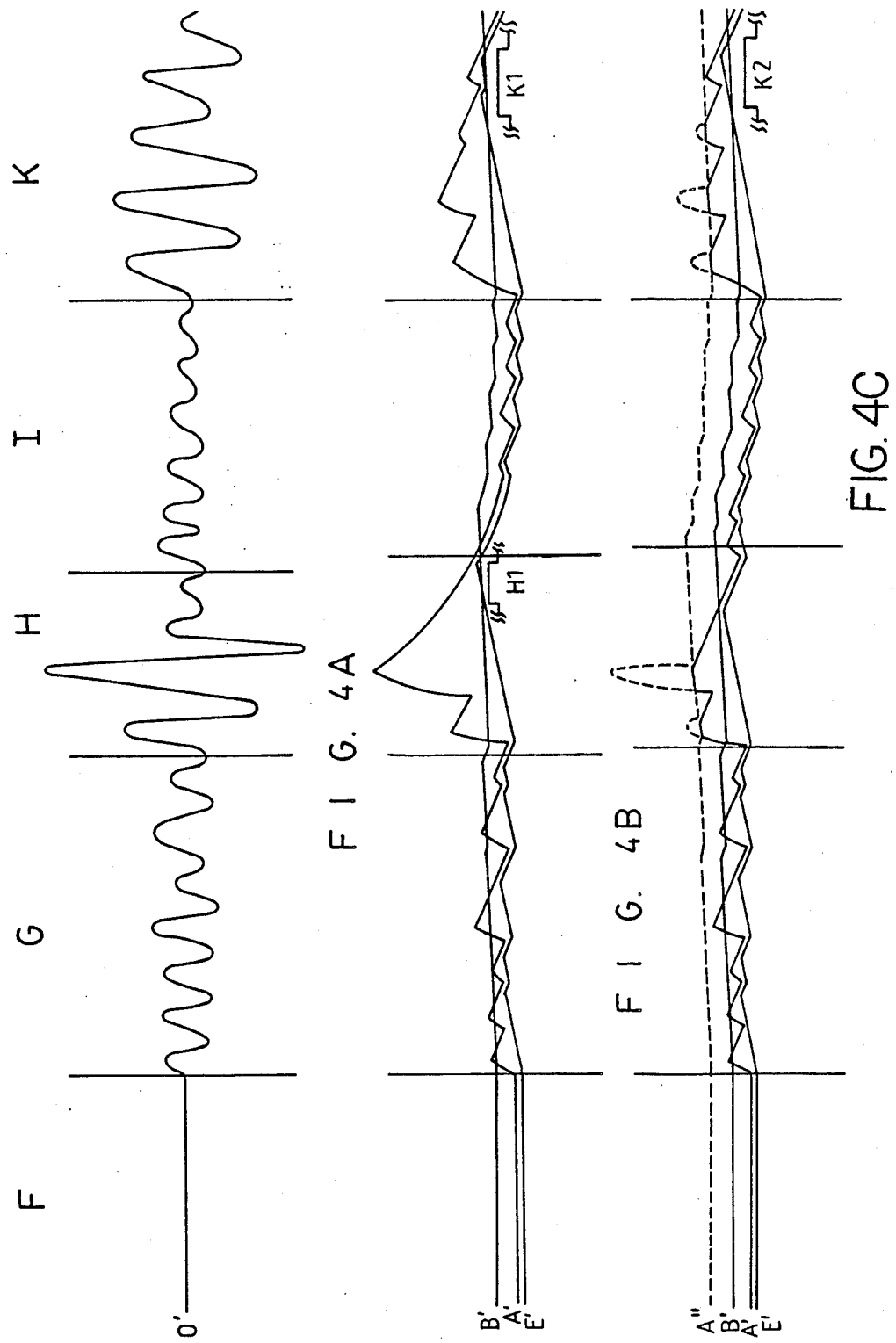

BASE POINT FLOATING CUT OFF WAVE FORM DIFFERENTIAL SIGNAL DETECTOR CIRCUIT

This is a continuation of copending application Ser. No. 071066,539 filed on June 26, 1987, now abandoned.

BACKGROUND OF THE INVENTION

This invention relates, generally, to a differential signal detector circuit and, specifically, to a floating base point wave form cutoff differential signal detector circuit.

The best-known circuit that has been used to detect a differential signal is preset to a maximum allowable differential signal value or base point and generates the detection signal when the differential signal is larger than the preset base-point value. A typical differential signal detector of this type has an operational amplifier with its positive pole (operational input) connected to receive the differential signal and its negative pole (operational input) connected to two voltage-dividing resistors to preset the base-point value described above.

Such a differential signal detector circuit produces false detection signals easily in many applications. For example, in a burglar alarm system using a microwave or ultrasonic sensor for generating the differential signal, changes in the sensed environment, from changed furniture or a blowing curtain, for example, change the differential signal from the sensor and make the circuit generate unpredictable detection signals. The changes described above occur frequently in a house, for example, because the furniture is regularly changed and window opening is necessary, so such a burglar-alarm system in a house under these conditions will make wrong detection signals easily. Besides, other conditions, such as a moth close to the sensor, can lead to the same result, too.

SUMMARY OF THE INVENTION

The main object of this invention is, therefore, to provide a floating base point wave form cutoff differential signal detector circuit in which a preset base point or maximum differential will float in accordance with changes in the environment, over a limited range in the short time, to avoid generating wrong detection signals.

Another object of this invention is to provide a floating base point wave form cutoff differential signal detector circuit which provides an effective range of differential signal detection which is not so large as to prevent detection of a sudden differential signal change or power supply interruption.

Still another object of this invention is to provide a floating base point wave form cutoff differential signal detector circuit which expands the range of monitoring, thereby also reducing the cost of quality control and the ratio of bad product to good.

The floating base point wave form cutoff differential signal detector circuit provided by this invention uses a transformed and amplified differential signal from a sensor that produces a voltage signal, a known transformation circuit that transforms the voltage signal and an amplifier set that amplified the transformed voltage signal. The differential signal detector circuit has a rectifying element to cutoff any negative value of the signal from the amplifier set and an energy storage element with its positive pole connected to the rectifying element. A floating base point loop has a directional impedance for a fixed voltage difference element connected to the positive pole of the energy storage element described above. A timer element has a positive pole connected to the positive direction end of the fixed voltage difference element, and a charging element and a base-point setting element connect to the positive pole end of the timer element described above. A wave form cutoff loop having a high input impedance amplifies the voltage signal of the timer element into a feed back signal which limits the differential level of the positive-pole end of the energy storage element described above. A voltage balance loop has a pair of fixed voltage difference elements and a discharging element which connects to the middle point of the pair to provide a voltage difference between its two ends which approaches to zero. A floating comparing detector has a charging element and a timer element with a charging time constant that is shorter than the time constant of the charging element and timer element in the floating base point loop described above to permit the voltage of the positive pole of the timer element of the floating comparing detector to overtake the voltage of the positive pole of the floating base point loop for a differential signal detecting output from a differential signal amplifying element.

The drawings show schematics and wave form analyses of practical embodiments in which:

FIG. 3 is a circuit schematic for another embodiment in accordance with this invention similar to that in FIG. 2, but with two added switches; and FIGs. 4A-4C are waveforms of a differential signal input and the responses thereto of the embodiment of FIG. 3 in different switch conditions thereof.

Figure 1:
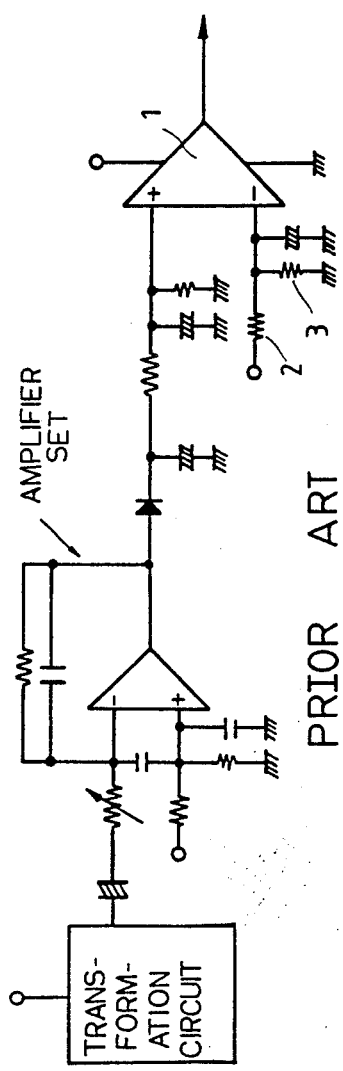
FIG. 1 is a circuit schematic of a best-known, prior-art differential signal detector circuit described above.
Figure 2:
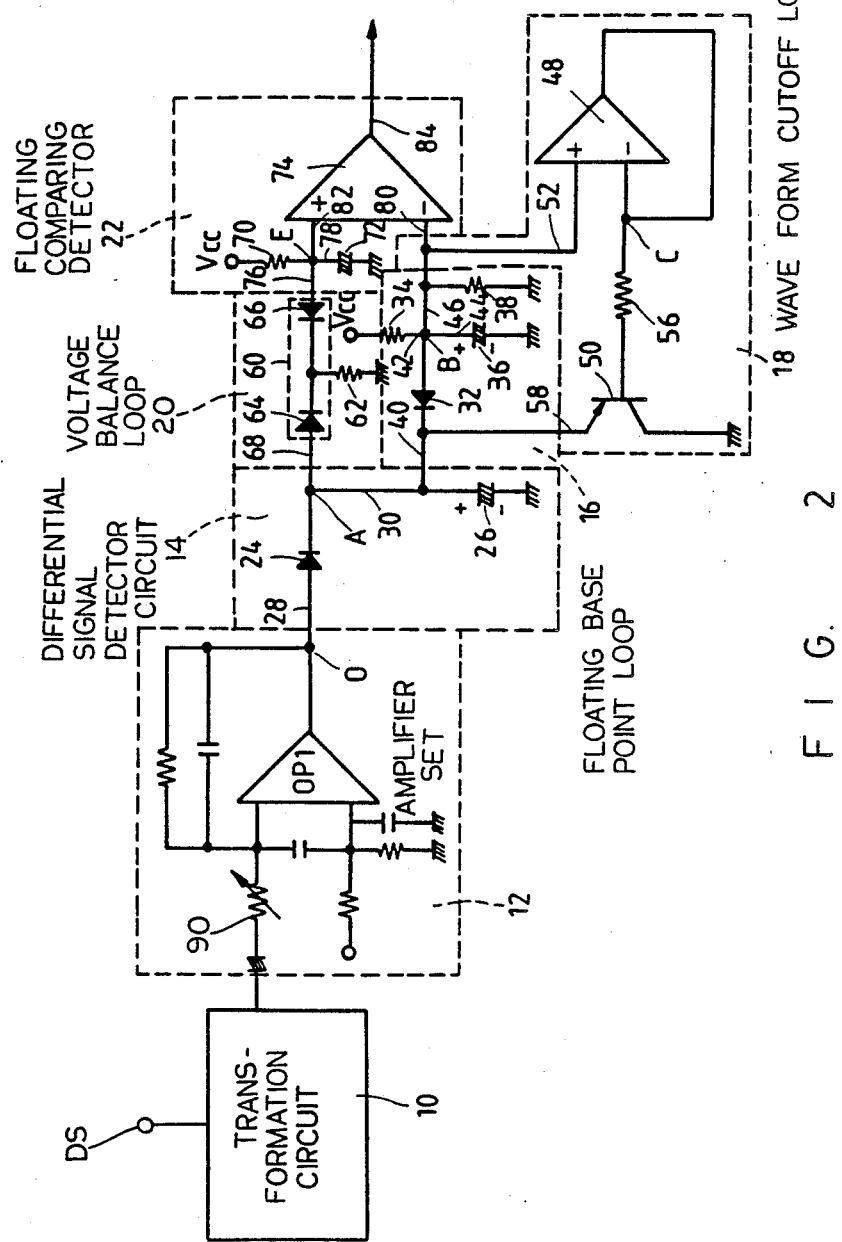
FIG. 2 is a circuit schematic for one embodiment in accordance with this invention.

The floating base point wave form cutoff differential signal detector circuit of FIG. 2 has a differential signal detector circuit 14, a floating base point loop 16, a wave form cutoff loop 18, a voltage balance loop 20 and a floating comparing detector 22 connected to a differential signal analog transformation circuit 10 and amplifier set 12. The differential signal analog transformation circuit 10 and amplifier set transform a differential signal of temperature, frequency, energy or the like provided to the former at DS that a sensor (not shown) has sensed as a voltage signal, and amplify the voltage signal for output at point 0.

The differential signal detector loop 14 has a rectifying element 24 and a storage element 26. The rectifying element 24 is a diode. It is connected to the output point O of the amplifier set via line 28 to cut off the amplified voltage signal thereat when less than a voltage on the energy storage element 26. The energy storage element 26 is a capacitor with its positive-pole end connected to the negative-pole output end of the diode 24 via line 30 for charging when the positive value of the amplified voltage signal passes through the diode to change the voltage potential of positive-pole end point A located on line 30.

The floating base point loop 16 has a fixed voltage directional impedance-difference element 32 connected in the lower impedance direction to the positive-pole end point A, a charging element 34 and a timer element 36 in parallel with a base point value setting element 38. More specifically, the directional impedance-difference element 32 is a diode, the negative pole end of which is connected to point A via a line 40. In the static state, therefore, the voltage difference between the positive pole end of diode 32 and point A is a fixed value. The charging element 34 is resistor with one end connected to a voltage supply point Vcc and the other end connected to the positive pole end, point B, of the diode 32 via a line 42. The timer element 36 is a capacitor, its positive pole end being connected to point B via a line 44. The element 38, which presets the maximum allowable floating base point value, is a voltage-dividing resistor, one end of which is connected to the point B via line 46 and the other end of which is grounded. Thus, when the voltage of point A is higher than the voltage of point B, the charging resistor 34 charges the timer capacitor 36. This charging stops when the voltage difference between point A and point B equals the interior voltage difference in the diode 32. Thus, the voltage of point B, which is set by voltage-dividing resistors 34, 38, presets the maximum floating base point voltage. The speed of charging to the maximum floating base point voltage is controlled, too, by charging resistor 34, voltage divider resistor 38 and timer capacitor 36.

The wave form cutoff loop 18 has a current amplifying element 48 with a high input impedance and a clipping element 50. The current amplifying element 48 with high input impedance is an emitter coupler having an input connected to point B in the floating base point loop 16 via line 52 to current amplify the current of the floating base point voltage through the emitter coupler 48 to an output point C. The clipping element 50 is a PNP transistor having its base connected to the output point C of the emitter coupler through a current limiting resistor 56. The emitter of transistor 50 is connected to point A in the differential signal detector loop 14 via line 58 and its collector is grounded. Thus the cutoff voltage at point A is, approximately, the voltage of point B in base point floating loop 16 plus the voltage difference of the current limiting resistor 56 and the base-emitter voltage difference of transistor 50. This limits the raising voltage of point A, i.e. the voltage across capacitor 26, in the differential signal detector circuit 14 to a value below the maximum base point voltage of point B in the floating base point loop 16.

The voltage balance loop 20 has a pair of fixed voltage difference elements 60 with no directional impedance difference and a discharging element 62 therebetween for voltage balance. The pair of fixed voltage difference elements 60 is two diodes 64, 66 facing each other, i.e. with connected negative poles. The positive pole of diode 64 is connected to point A in the signal detector loop 14 via a line 68. The positive pole of diode 66 is connected to point E of the floating comparing detector 22, as later described. The discharging element 62 for balancing the voltage is a resistor having one end connected to the negative poles of diodes 64, 66 and its other end grounded. As a result, the voltage difference between the two positive poles of the diodes approaches zero to balance the voltage potential.

The floating comparing detector 22 has a charging element 70, a timer element 72 and a differential signal amplifying element 74. The charging element 70 is a resistor having one end connected to the power supply Vcc, and its other end connected at point E to the positive pole of the diode 66 described above. The timer element 72 is a capacitor having one end connected to point E via line 78, and its other end grounded, to make the resistor 70 and capacitor 72 form an RC charging timer circuit. The time constant of the RC charging timer circuit is shorter than the time constant of the RC charging timer circuit formed of the resistor 34 and capacitor 36 of the floating base point loop 16 to let the voltage of point E overtake the voltage of point B in chasing from a lower voltage. The differential signal amplifying element 74 is an operational amplifier having its negative input connected to point B in the floating base point loop 16 via a line 80, and its positive input connected to point E via a line 82. Its output 84 provides the differential signal detection signal.

When the differential signal fed into the circuit at DS is in a static state, the voltage on the negative input of operational amplifier 74 is greater than the voltage on the positive input by about the voltage difference across diode 32, and the output 84 of the operational amplifier therefore provides a low voltage. When the differential signal fed into the circuit at DS varies, however, then point A in the detector loop 14 will first have the change in the differential signal from the amplifier set 12 as detected by the diode 24 as a rise in the voltage, for example, and then the voltage of points B and E rises, as controlled by the voltage of point A and the respective RC charging circuits. After a period of chasing, if the voltage of point E is over the voltage of point B, the voltage of the positive input of the operational amplifier 74 is higher than the voltage of its negative input, and its output 84 will provide a high voltage as detection of the rise in the differential signal to be detected.

The circuit indicated in FIG. 3 is substantially the same as the circuit in FIG. 2 and, therefore, referenced correspondingly, with primes and only the differences described. The only differences in the circuit of FIG. 3 over that of FIG. 2 are to add switch 86 to line 28', and switch 88 to line 58'. It is not necessary to add these two switches when producing the circuit practically; they appear here only for providing wave forms for analyzing the circuit.

FIGS. 4A, 4B and 4C show these wave forms respectively when both switches 86 and 88 are open, only switch 86 is closed, and both switches 86 and 88 are closed. Thus, timing section F shows in FIGS. 4B and 4C the signals obtained when the differential signal output of point 0' (FIG. 3) is a smooth direct-current signal, as shown in FIG. 4A. Sections G and I show the signals obtained from some noise in the differential signal at O', from the power supply (not shown) therefor or the sensed environment it represents, as amplified by the amplifier set 12, for example. Section H shows the initial large signal from a power supply interruption, or a moth, beetle or the like flying close to the sensor providing the differential signal, for example, after the signal is amplified by the amplifier set 12. Section K shows the amplified differential signal from such a sensor if a person invades the environment monitored thereby, i.e. the differential signal to be detected.

For FIG. 4B, only the switch 86 is closed and the results in accordance with the signal in FIG. 4A shown for each indicated point A', B', E' in the circuit of FIG. 3. In other words, the wave form cutoff loop 18 (FIG. 2) does not work in this state of the circuit. Then, as indicated in FIG. 4B, at section F, which represents the static state, the voltage difference between points A' and point B' is fixed (at the directional voltage difference in diode 32, as noted above), and the voltage of point E' is the same as the voltage of point A'. In sections G, H, I, and K, point A' is seen to have a rising voltage in synchronism with that of point O' (FIG. 4A), but at a voltage that is lower by the directional voltage drop across the diode 24. When the voltage of point A' has risen to the voltage of point B', i.e. when there is a negative directional voltage difference across diode 32', capacitor 36 starts to be charged through resistor 34', with its voltage rising in a curve decided by capacitor 36' and resistors 34' and 38', as described above. When the voltage of point A' has risen to a voltage that is higher than that of point E', the resistor 70 starts to charge the capacitor 72', and the speed at which its voltage rises is decided by resistor 70' and capacitor 72', but this is faster than that of point B' rises. When the voltage of point O' drops, that of point A' will drop, too, following that of point O' (capacitor 26' discharging through diode 64' and resistor 62', until voltage of point E' equals that of point B' less the directional voltage difference in diode 32', i.e. points A', E', and B' recover the fixed voltage difference of section F. In sections G and I, the floating base point can recover from the amplified noise, i.e. the voltage of point E' remains below that of point B'. But in section H of FIG. 4B, as in section K, where intended, the voltage at point A' becomes very high and, after a period of chasing, the voltage of point E' will be over that of point B' at time H1. The output end 84' of the operational amplifier set 74' will then output a high voltage of detected differential signal at time H1 which, however, is not the output signal desired, as at time K1.

If both switches 86, 88 are closed, then the wave form of each point A', B', E' in the circuit is as indicated in FIG. 4C. That is, after adding the wave form cutoff loop 18 (FIG. 2) to the circuit by closing switch 88, there is a substantial change of condition in section H. Now, when the voltage from point A' across diode 32' exceeds the voltage across resistor 56' and diode 24' in the detector loop 24, then transistor 50' cuts this off. The effective voltage of curve A" of point A' is thus more like the floating base point curve B'. That is, the voltage difference between the cutoff point and the base point is fixed. Thus, in section H, since the signal of point A' is limited, the chasing time for point E' is not enough, so that, before the voltage of point E' is over the voltage of point B', transistor 50' has started to discharge point A'.

Nevertheless, the effective sensitivity is not affected by the above-described improvement in stability. As shown in section K of FIG. 4C, in cutting off the voltage of three peak waves, the sensitivity is not different in that detection occurs at time K2, which corresponds to time K1 (FIG. 4B). On the contrary, the stability increases and the affect of noise decreases, so that the invention can expand the range monitorable by adjusting the adjustable resistor 90 of amplifier set 12 to increase the amplification gain of the amplifier set.

People who are practiced in this field will be able to vary the above design without departing from the spirit of this invention, or the range of the patent thereon with respect to the following claims.

What is claimed is:

1. In a differential signal detector circuit comprising differential-signal input means comprising an amplifier for providing an amplified differential signal from a sensor, a differential signal detector for detecting the amplified differential signal to provide a detecting signal and a comparing detector having a timer with a time constant for comparing the detecting signal with a base point signal and providing a differential signal detection signal when the detected differential signal differs sufficiently from the base point signal, a floating base point signal improvement, comprising:

a floating base point loop (16) for providing the base point signal, the floating base point loop comprising a base point value setting element (38) for setting a maximum value of the base point signal, a timer element (36) having a time constant and a charging element (34) for timing charging of the base point value setting element to the maximum base point value, the time constant of the timer element being longer than the time constant of the timer in the comparing detector, and a fixed directional impedance element (32) connecting the base point value setting element to the differential signal detection circuit for affecting the detecting signal thereof;

a wave form cutoff loop (18) comprising a current amplifying element (48) responsive to the timed charge to the maximum base point value of the floating base point loop and a clipping element (50) responsive to the current amplifying element for cutting off the affect of the floating base point loop on the detecting signal of the differential signal detection circuit; and a voltage balance loop (20) comprising a pair of fixed voltage difference elements (64, 66) connected to each other for no directional impedance difference therebetween and a discharging element (62) connected between the pair of fixed voltage difference elements for voltage balance, the pair of fixed voltage difference elements connecting the differential signal detector circuit to the comparing detector.

* * * * *